United States Patent [19]
Cazaux et al.

[11] Patent Number: 5,309,124
[45] Date of Patent: May 3, 1994

[54] ANALOG VARIABLE PHASE SHIFTER WITH ACTIVE MATCHING CIRCUITS

[75] Inventors: Jean-Louis Cazaux, Toulouse; Robert-Alain Perichon, Toulouse, both of France

[73] Assignee: Alcatel Espace, Courbevoie, France

[21] Appl. No.: 831,445

[22] Filed: Feb. 5, 1992

[30] Foreign Application Priority Data

Feb. 6, 1991 [FR] France ................................ 91 01314

[51] Int. Cl.[5] .......................................... H03H 11/20
[52] U.S. Cl. ...................... 333/139; 333/32; 333/164
[58] Field of Search ............... 333/138, 139, 156, 164, 333/32; 330/311, 277, 294; 307/511, 262

[56] References Cited

U.S. PATENT DOCUMENTS 5,006,823  4/1991  Baril et al. ............................ 333/164

FOREIGN PATENT DOCUMENTS 0102006  6/1985  Japan ................................ 333/164
0005103  1/1989  Japan ................................ 333/32
0012712  1/1989  Japan ................................ 333/164

OTHER PUBLICATIONS

"A Novel Microwave Transmission Phase-Shifter", J. Ph. Coupez et al., pp. 1023-1027; 18th European Microwave Conference-Stockholm 1988.

Universite Du Languedoc, FR, 6ES Journees Nationales Microondes, Jun. 21, 1989, Montpellier, France, pp. 25-26; Coupex et al., "Une Solution pour les Systemes de Communications Grand Public Autour de 1 GHZ: Le Dephaseur en Transmission a TEC et Diodes Varac".

Patent Abstracts of Japan, vol. 13, No. 513 (E-847) Nov. 16, 1989 & JP-A-01 208 908 (Kenkyusho), Aug. 22, 1989.

Horowitz et al. "The Art of Electronics", 1980, University of Cambridge, Cambridge, GB pp. 235, 236.

*Primary Examiner*—Seungsook Ham
*Attorney, Agent, or Firm*—Sughrue, Mion, Zinn, Macpeak & Seas

[57] ABSTRACT

An analog variable phase shifter comprises a phase shift circuit and associated active inlet and outlet matching circuits. The phase shift circuit includes a transistor with negative feedback, and the inlet and outlet matching circuits are of the type used for matching a wideband microwave signal amplifier over the entire range of frequency variation in the microwave signals applied to the amplifier.

19 Claims, 2 Drawing Sheets

ANALOG VARIABLE PHASE SHIFTER WITH ACTIVE MATCHING CIRCUITS

The present invention relates to an analog variable phase shifter for microwave signals.

BACKGROUND OF THE INVENTION

Such phase shifters may be used, in particular, in array type antennas which include components for adjusting the beam emitted or received by said antennas, the components themselves comprising sets of unit modules spaced apart at an array pitch for adjusting the phases and the amplitudes of the microwave signals they receive.

In space applications, and more particularly for space equipment using miniaturized versions of array type antennas that are of the so-called "active antenna" type, it is necessary to obtain as great a degree of miniaturization as possible in said unit modules, and in particular in their unit circuits for phase adjustment, while retaining adjustment accuracy that is as fine as possible over as large as possible a range of phase shifts.

Other criteria required by this type of application consist in reducing the power consumption of the unit circuits as much as possible and in matching their impedances as closely as possible so as to make it possible to interconnect them directly in cascade with other circuits without using intermediate isolating circuits.

Existing phase shifters for microwave signals can be classified into two categories:

analog phase shifters capable of providing continuous variation in phase shift by acting on a control voltage; and digital phase shifters capable of providing stepwise variation of phase shift through steps of fixed predetermined value.

Digital phase shifters can readily be made using monolithic integrated technology, and thus satisfy the above-mentioned miniaturization requirement, but as mentioned above they do not provide sufficiently fine adjustment of phase shift.

Analog phase shifters can themselves be classified into a plurality of categories:

"vector modulation" phase shifters based on the principle of splitting the input signal into four equal fourths at mutual 90° phase shifts, thereby creating four same-amplitude orthogonal vectors. Thereafter, each of these vectors is attenuated by a variable attenuator and then the four signals obtained in this way are recombined and the resulting output signal is at a given phase shift relative to the input signal, which shift thus depends on the values of the four attenuations applied to the signal. The drawbacks of this solution lie in the complexity of the circuit (requiring three dividers, four attenuators, and three combiners), in the lack of accuracy in the final phase shift, and above all in the DC power consumption of the circuit being far from being negligible which makes it quite unsuitable for space applications;

"reflection" phase shifters based on the principle of splitting the input signal over the direct and coupled paths of a 3 dB hybrid coupler (of the Lange's coupler type). Identical L-C cells (made up of inductors and variable capacitance capacitors constituted by varactor diodes) are placed on said paths and they reflect the signals which recombine at the outlet with a certain phase shift. The main drawback of this topology lies in the large area occupied by the circuit which makes it rather difficult to integrate into monolithic technology; and phase shifters based on varying the angle of the transmission coefficient of a transistor having negative feedback provided by means of a variable reactance.

A phase shifter of that type is described in the document: 18th European Microwave Conference—Stockholm 1988 "A novel microwave transmission phase shifter" by J. P. Coupez and R. A. Perichon. The variable reactance is formed by connecting in series an inductance and a variable capacitance capacitor constituted by a varactor diode to make a monolithic integrated circuit implementation possible. However, that phase shifter does not include associated inlet and outlet matching circuits which means that its performance in practice is quite mediocre.

FIG. 1 is a Smith chart showing various values for the inlet reflection coefficient S11 and the outlet reflection coefficient S22 of such a phase shifter without inlet and outlet matching circuits. These various values are obtained over a set of control voltage values for the varactor diodes constituting the variable capacitance capacitors (five values in this case), and at each of these values, frequency is also varied over a certain range giving rise to a set of curved arcs in FIG. 1 which show the way in which said reflection coefficients vary.

An object of the present invention is to provide such inlet and outlet matching circuits that are effective over the entire range of reactance variation in the negative feedback of the transistor for a given range of operating frequencies.

SUMMARY OF THE INVENTION

The present invention is based on the observation that the ways in which the inlet and outlet reflection coefficients vary in such a phase shifter circuit when said reactance is caused to vary are analogous with the ways in which the inlet and outlet reflection coefficients of a wideband amplifier vary when its operating frequency is varied, and this observation makes it possible to adapt a solution used in the second case and described below for use in the first case.

The present invention provides an analog variable phase shifter for microwave signals, comprising a phase shifter circuit per se, itself including a transistor having negative feedback via a variable reactance, together with active inlet and outlet matching circuits providing such matching over the entire range of variation of said variable reactance, and being of the type used for matching a wideband microwave signal amplifier over the entire range of frequency variation in the microwave signals applied to said amplifier.

BRIEF DESCRIPTION OF THE DRAWINGS

An embodiment of the invention is described by way of example with reference to the accompanying drawings, in which.

DETAILED DESCRIPTION

Figure 1:
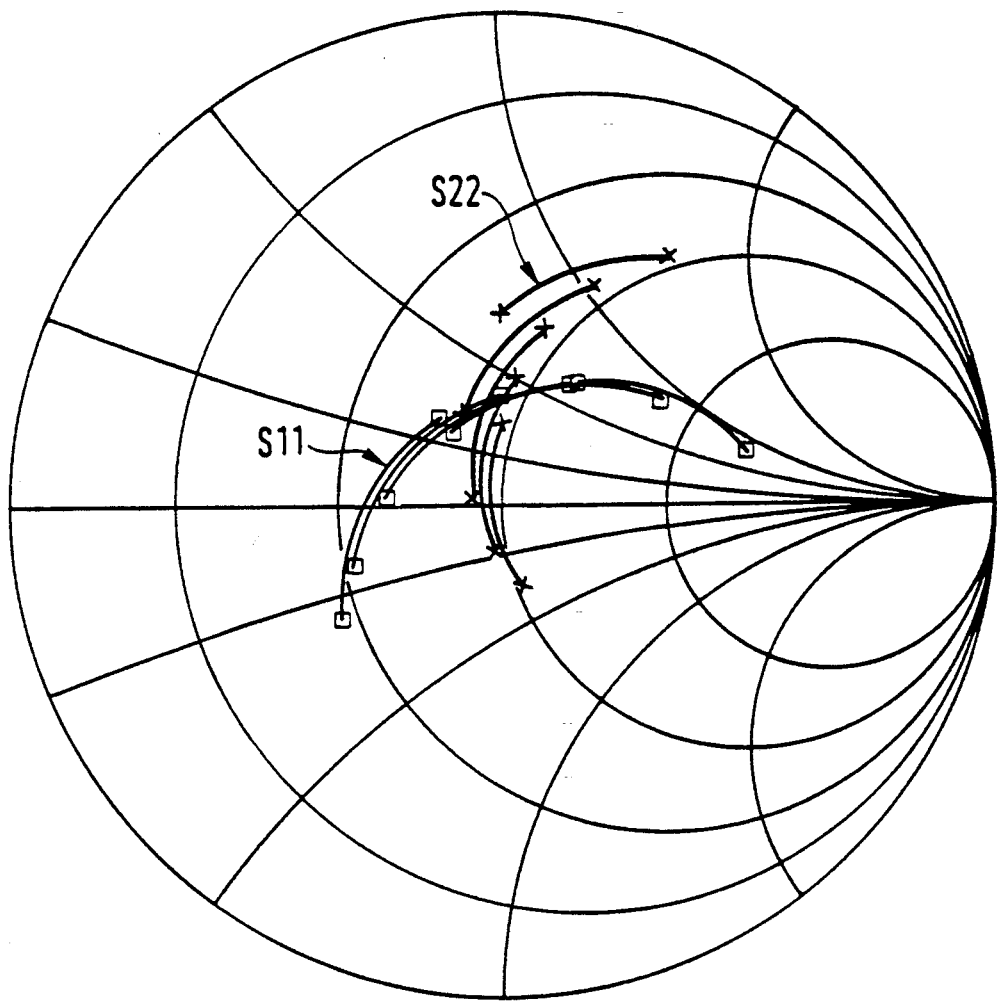
FIG. 1 is a Smith chart described above.
Figure 2:
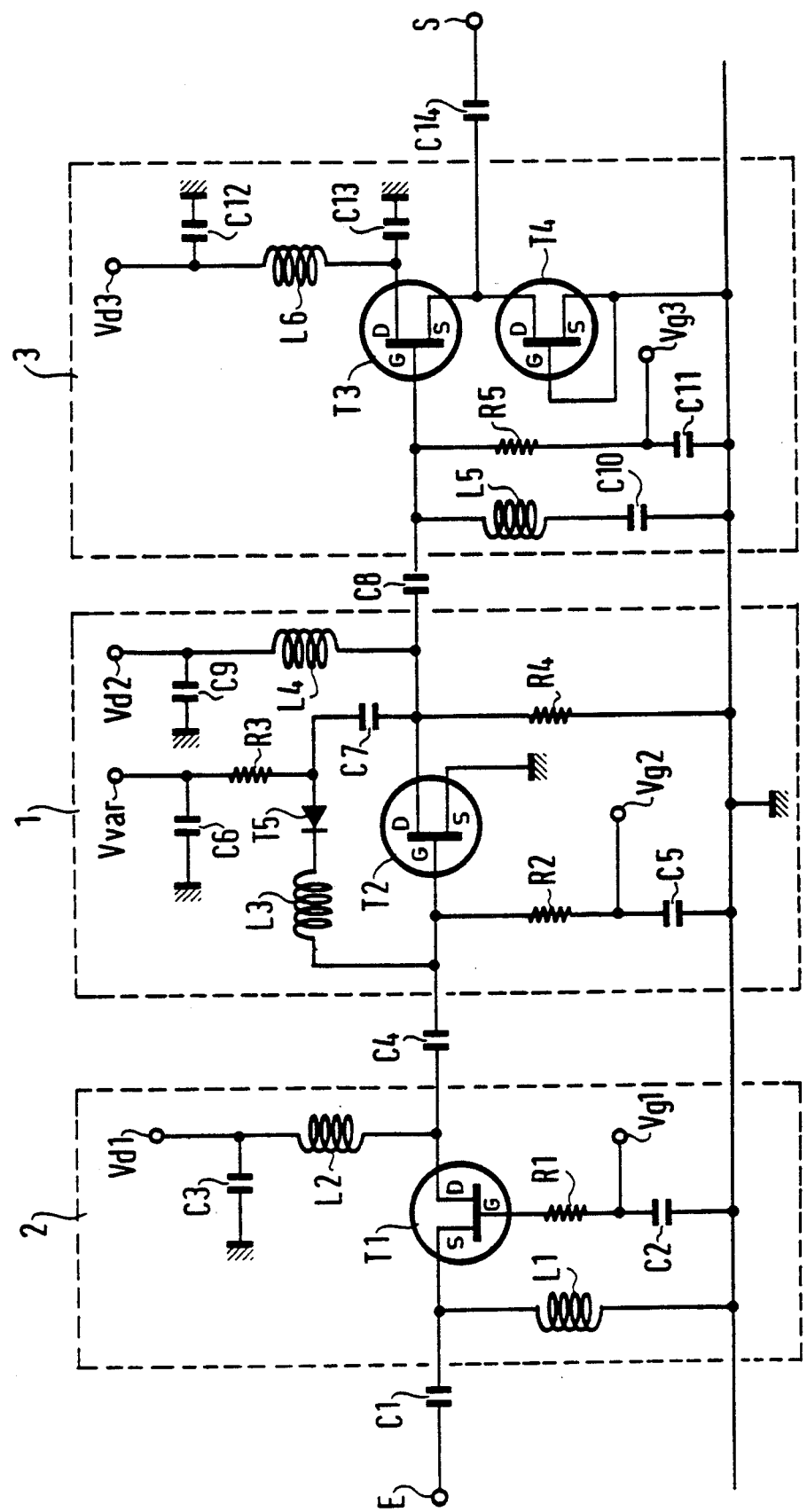
FIG. 2 is a circuit diagram of a phase shifter of the invention provided with active inlet and outlet matching circuits.

The circuit of FIG. 2 can be implemented in monolithic technology. It comprises a phase shifter circuit per se given reference 1, an active inlet matching circuit given reference 2, and an active outlet matching circuit given reference 3.

In this example, the phase shifter circuit per se 1 essentially comprises:

a common source connected field effect transistor T2;

a negative feedback circuit from the drain D to the gate G (hereafter referred to as the "grid"), of the transistor T2, said negative feedback circuit itself including an inductor L3 in series with a varactor diode (constituted by a field effect transistor T5 having its drain and source short-circuited together), with a capacitor C7 additionally serving to decouple the varactor diode from the drain of transistor T2;

components for connection to and/or for biasing the grid G of the transistor T2, namely DC voltage source Vg2, a resistor R2 (connected between G and Vg2) and a capacitor C5 (connected between ground and the point common to R2 and Vg2);

components for connection to and/or for biasing the drain D of the transistor T2, namely a DC voltage source Vd2, a resistor R4 (connected between D and ground), an inductor L4 (connected between D and Vd2), and a capacitor C9 (connected between ground and the point common to L4 and Vd2); and components for connection to and/or for biasing the anode of the varactor diode T5, i.e., the gate of the transistor used to form the varactor diode, namely a variable DC voltage source Vvar, a resistor R3 (connected between Vvar and the anode of diode T5), and a capacitor C6 (connected between ground and the point common to R3 and Vvar).

The resistors R2 and R4 also serve to stabilize the transistor T2.

In this example, the active inlet matching circuit 2 essentially comprises:

a common grid connected field effect transistor T1;

components for connection to and/or for biasing the grid G of the transistor T1, namely a DC voltage source Vg1, a resistor R1 (connected between G and Vg1), and a capacitor C2 (connected between ground and the point common to R1 and Vg1);

components for connection to and/or for biasing the source S of the transistor T1, namely an inductor L1 (connected between S and ground); and components for connection to and/or for biasing the drain D of the transistor T1, namely a DC source Vd1, an inductor L2 (connected between D and Vd1), and a capacitor C3 (connected between ground and the point common to L2 and Vd1).

The inductors L1 and L2 serve to improve the matching provided by the common grid connected transistor T1.

Finally, decoupling capacitors C1 and C4 are provided at the inlet and at the outlet of said inlet matching circuit.

In the example under consideration, the active outlet matching circuit 3 essentially comprises:

a common drain or "source-follower" connected field effect transistor T3;

components for connection to and/or for biasing the grid G of the transistor T3, namely a DC voltage source Vg3, a resistor R5 (connected between G and Vg3), a capacitor C11 (connected between ground and the point common to Vg3 and R5), and a series connected inductor L5 and capacitor C10 (connected between G and ground);

components for connection to and/or for biasing the drain D of the transistor T3, namely a DC voltage source Vd3, an inductor L6 (connected between D and Vd3), a capacitor C12 (connected between ground and the point common to Vd3 and L6), and a capacitor C13 (connected between D and ground); and components for connection to and/or for biasing the source S of the transistor T3, comprising in this case an active load connected between ground and the source S of the transistor T3, said active load being constituted by a field effect transistor T4 having its grid and its source short-circuited together and connected to ground, thereby enabling it to present very low DC impedance (so as to reduce the power consumption of the circuit), and very high impedance to microwaves.

The parallel inductor L5 connected to the grid of transistor T3 serves to improve the matching performed by said transistor connected as a source-follower.

Finally, decoupling capacitors C8 and C14 are respectively provided at the inlet and at the outlet of said outlet matching circuit.

The active inlet matching circuit 2 enables the assembly constituted by the phase shifter 1 and the outlet matching circuit 3 to present an input impedance equal to 50 Ω and an output impedance which is the conjugate of the input impedance of the assembly constituted by the phase shifter 1 and the outlet matching circuit 3.

The active outlet matching circuit 3 enable the assembly of the phase shifter 1 and the inlet matching circuit 2 to present an output impedance equal to 50 Ω and an input impedance which is the conjugate of the output impedance of the assembly constituted by the phase shifter 1 and the inlet matching circuit 2.

Said desired impedance values are obtained by giving appropriate values to the components constituting said matching circuits.

In particular, when using microwave monolithic technology (MMIC) it is possible to adjust the sizes of the transistors T1, T3, and T4 so as to optimize the inlet and outlet matching of the circuit.

In the embodiment described, the transistors T1, T2, T3, and T4 are field effect transistors. However they could be bipolar transistors. To cover the various possibilities, the term "control electrode" is used to designate a grid of a field effect transistor or the base of a bipolar transistor, the term "transfer electrodes" is used to designate the drain and the source of a field effect transistor or the collector and the emitter of a bipolar transistor.

By way of non-limiting example, the components used in the diagram of FIG. 2 may have the following component values:

| | | | |
|---|---|---|---|
| C1 = 0.6 pF | C8 = 6 pF | L1 = 0.9 nH | R1 = 5k |
| C2 = 10 pF | C9 = 10 pF | L2 = 2.8 nH | R2 = 2.5k |
| C3 = 10 pF | C10 = 10 pF | L3 = 1.2 nH | R3 = 5k |
| C4 = 10 pF | C11 = 10 pF | L4 = 5 nH | R4 = 1k |
| C5 = 10 pF | C12 = 10 pF | L5 = 0.7 nH | R5 = 5k |
| C6 = 10 pF | C13 = 10 pF | L6 = 5 nH | |
| C7 = 10 pF | C14 = 10 pF | | |

We claim:

1. An analog variable phase shifter for microwave signals, said phase shifter comprising:

a phase shift circuit having an input and output and including a first transistor having negative feedback via a variable reactance, together with active inlet and outlet matching circuits coupled to said input and output, respectively, of said phase shift circuit and providing such matching over the entire range of variation of said variable reactance, wherein the active outlet matching circuit comprises an outlet transistor having first and second transfer electrodes and an outlet control electrode and conducting between said first and second transfer electrodes in accordance with a signal at said control electrode, said control electrode being connected to an input of said outlet matching circuit to receive a signal from said first transistor, said first transfer electrode providing an output of said analog variable phase shifter and being coupled to ground via an active load having very low DC impedance and very high microwave impedance and said second transfer electrode being coupled to a reference potential.

2. A phase shifter according to claim 1, wherein the active inlet matching circuit comprises an inlet transistor having first and second transfer electrodes and a control electrode and conducting between said first and second transfer electrodes in accordance with a signal at said control electrode, said first transfer electrode of said inlet transistor being coupled to an input of said inlet matching circuit comprising an input of said phase shifter, said second transfer electrode of said inlet transistor being coupled to an output of said inlet matching circuit providing a signal to said first transistor, and said control electrode of said inlet transistor being coupled to a common reference for said input and output of said inlet matching circuit.

3. A phase shifter according to claim 1, wherein said active load comprises a load transistor having first and second transfer electrodes and a control electrode and conducting between said first and second transfer electrodes in accordance with a signal at said control electrode, said control electrode and first transfer electrode of said load transistor being short-circuited together and connected to ground, and said second transfer electrode of said load transistor being coupled to said first transfer electrode of said outlet transistor.

4. A phase shifter according to claim 1, made in the form of an integrated circuit in microwave monolithic technology.

5. A phase shifter according to claim 1, wherein said inlet matching circuit includes an input and an output, with the input of each matching circuit being coupled to a respective reference potential through a reactive element.

6. A phase shifter according to claim 1, wherein said inlet matching circuit includes an input and an output, with the output of said inlet matching circuit being coupled to a reference potential through a reactive element.

7. A phase shifter according to claim 5, wherein said respective reference potentials for each matching circuit comprise a common reference potential.

8. A phase shifter according to claim 2, further comprising a reactive element in each of said inlet and outlet matching circuits coupled between at least one of said transfer electrodes and said reference potential.

9. A phase shifter according to claim 2, wherein each of said inlet and outlet transistors includes a gate, source and drain as said control electrodes and first and second transfer electrodes, respectively, and each of said inlet and outlet transistors conducting between its source and drain in accordance with a signal at its gate, and a reactive element coupled between each said drain and a reference potential.

10. A phase shifter according to claim 5, wherein said reactive element comprises an inductor in each matching circuit.

11. A phase shifter according to claim 6, wherein said reactive element comprises an inductor.

12. A phase shifter according to claim 7, wherein said reactive elements coupling the inputs to said respective reference potential comprises an inductor in each matching circuit.

13. A phase shifter according to claim 8, wherein said reactive element comprises an inductor in each matching circuit.

14. A phase shifter according to claim 1, wherein said second transfer electrode of said outlet transistor is coupled to a first reference potential through a reactive element.

15. A phase shifter according to claim 14, wherein said reactive element comprises an inductor.

16. A phase shifter according to claim 15, wherein said second transfer electrode of said outlet transistor is coupled to a second reference potential through said inductor and a capacitor.

17. A phase shifter according to claim 1, wherein said inlet matching circuit includes an inlet transistor having first and second transfer electrodes and a control electrode with said inlet transistor conducting between its first and second transfer electrodes in accordance with a signal at its control electrode, an output of said inlet matching circuit being coupled to said second transfer electrode of said inlet transistor, and said second transfer electrode of said inlet transistor being coupled to a first reference potential through a reactive element.

18. A phase shifter according to claim 17, wherein said reactive element comprises an inductor.

19. A phase shifter according to claim 18, wherein said second transfer electrode of said inlet transistor is coupled to a second reference potential through said inductor and a capacitor.

* * * * *